US006990033B2

(12) United States Patent
Cho

(10) Patent No.: US 6,990,033 B2

(45) Date of Patent: Jan. 24, 2006

(54) BUFFER DEVICE FOR A CLOCK ENABLE SIGNAL USED IN A MEMORY DEVICE

(75) Inventor: Joo Hwan Cho, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/963,102

(22) Filed: Oct. 12, 2004

(65) Prior Publication Data

US 2005/0243615 A1 Nov. 3, 2005

(30) Foreign Application Priority Data

Apr. 28, 2004 (KR) ..................... 10-2004-0029593

(51) Int. Cl.
*G11C 7/00* (2006.01)

(52) U.S. Cl. .................. 365/222; 365/189.05; 365/233

(58) Field of Classification Search ................ 365/222, 365/189.05, 233
See application file for complete search history.

(56) References Cited

U.S. PATENT DOCUMENTS

2003/0076726 A1 * 4/2003 Cowles et al. ......... 365/189.05
2005/0195674 A1 * 9/2005 Jang .......................... 365/222

* cited by examiner

*Primary Examiner*—Huan Hoang
(74) *Attorney, Agent, or Firm*—Ladas & Parry LLP

(57) ABSTRACT

Disclosed is a buffer device for a clock enable signal in a memory device that is used when the memory device escapes from a self-refresh mode. The buffer device includes a first buffer for comparing a clock enable signal with an external reference voltage in accordance with a self-refresh flag signal, a second buffer for outputting a signal corresponding to the self-refresh flag signal as the clock enable signal, a comparator for comparing the external reference voltage applied from an outside with an internal reference voltage internally generated, and a switching unit for selecting and outputting an output of the first buffer if the external reference voltage is higher than the internal reference voltage and selecting and outputting an output of the second buffer if the external reference voltage is lower than the internal reference voltage in accordance with an output signal of the comparator.

4 Claims, 2 Drawing Sheets

VDD
201
VSS
202
Vint
VREF
VSS
204
SW21
VDD
VSS
VSS
CKE
VREF
OUT
VSS
Self-flag
VSS
SW22
VREF
203
21
23
22
24

OUT
SW21
SW22
204
203
24
202
VREF
VDD
VSS
22
23
201
21
Vint
CKE
Self-flag
VREF

BUFFER DEVICE FOR A CLOCK ENABLE SIGNAL USED IN A MEMORY DEVICE

BACKGROUND OF THE INVENTION

1. Field of the Invention

The present invention relates to a buffer device, and more particularly to a buffer device for a clock enable signal used in a memory device that is used when the memory device escapes from a self-refresh mode.

2. Description of the Prior Art

As generally known in the art, a volatile memory (hereinafter referred to as a memory device) is kept in an idle state before it performs a read/write operation. In the idle state, a clock enable (CKE) signal applied to the memory device is at a low level, i.e., in a disable state. Here, the clock enable (CKE) signal is used to control the operation of a buffer that receives a main clock being applied to the memory device. While the CKE signal is in a disable state, i.e., in an idle state, the memory device does not operate normally.

Also, while the CKE signal is kept in an idle state, the memory device periodically performs a refresh operation in order to prevent the loss of data stored in memory cells.

The refresh is performed in either a self-refresh mode or an auto-refresh mode.

The self-refresh is to refresh data periodically in the memory device itself, and the auto-refresh is to refresh data by a command of an external system. Hereinafter, the self-refresh operation will be explained as the refresh operation.

Generally, in the refresh state, a CKE buffer that receives a CKE signal does not perform a normal operation. In order for the memory device to escape from the self-refresh mode, a CKE signal of a high level is applied from the outside to the memory device and a separate buffer for recognizing the CKE signal is provided.

In the related art, a buffer for recognizing that the memory device escapes from the self-refresh mode is of a comparator type having a differential amplifier structure, and this comparator type buffer receives the CKE signal.

Typically, the comparator type buffer has two input terminals. A reference voltage of a specified level is applied from the outside to one input terminal, and a voltage applied through a CKE pin is applied to the other input terminal.

Here, the CKE pin is a clock enable pin used in the memory device. In an idle state, the CKE pin is kept at a low level while in an active state, it is kept at a high level.

In the idle state, the voltage of the CKE pin is of a low level, and the external reference voltage is kept at a specified voltage level. Accordingly, the comparator outputs a signal for keeping the self-refresh mode.

However, if the memory device enters into the active mode, the voltage of the CKE pin goes to a high level that is higher than the reference voltage level. Accordingly, the comparator output a signal for escaping from the self-refresh mode.

The above-described operation is possible on the assumption that the reference voltage applied to the CKE buffer is constant.

Recently, in order to reduce power consumption, some mobile products adopt a low level as the reference voltage level applied from the outside. In this case, the use of the conventional comparator type buffer as it is may cause malfunction of the memory device.

That is, if the reference voltage level is changed, the memory device may escape from the self-refresh mode at a undesirable time, and this may cause a problem in the operation of the memory device.

SUMMARY OF THE INVENTION

Accordingly, the present invention has been made to solve the above-mentioned problems occurring in the prior art, and an object of the present invention is to provide a buffer device for a clock enable signal in a memory device which can selectively operate in accordance with the level of a reference voltage when the memory device escapes from a self-refresh mode.

Another object of the present invention is to provide a buffer device for a clock enable signal in a memory device which uses a CMOS type buffer as a clock enable buffer if an external reference voltage is of a low level while it uses a comparator type buffer as the clock enable buffer if the external reference voltage is kept at a specified level, when the memory device escapes from a self-refresh mode.

In order to accomplish these objects, there is provided a buffer device for a clock enable signal in a memory device comprising a first buffer for comparing a clock enable signal with an external reference voltage in accordance with a self-refresh flag signal, a second buffer for outputting a signal corresponding to the self-refresh flag signal as the clock enable signal, a comparator for comparing the external reference voltage applied from an outside with an internal reference voltage internally generated, and a switching unit for selecting and outputting an output of the first buffer if the external reference voltage is higher than the internal reference voltage and selecting and outputting an output of the second buffer if the external reference voltage is lower than the internal reference voltage in accordance with an output signal of the comparator.

Here, it is preferable that the self-refresh flag signal is at a high level corresponding to the self-refresh mode and at a low level corresponding to a normal mode, and the comparator and the first buffer are enabled if the self-refresh flag signal is at the high level and disabled if the self-refresh flag signal is at the low level.

It is also preferable that the second buffer is implemented by a CMOS type buffer that operates in accordance with the clock enable signal, and comprises a first delay unit for receiving the self-refresh flag signal, a first NAND gate for receiving the clock enable signal and an output signal of the first delay unit, a second delay unit for receiving an output signal of the first delay unit, and a second NAND gate for receiving an output signal of the second delay unit.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
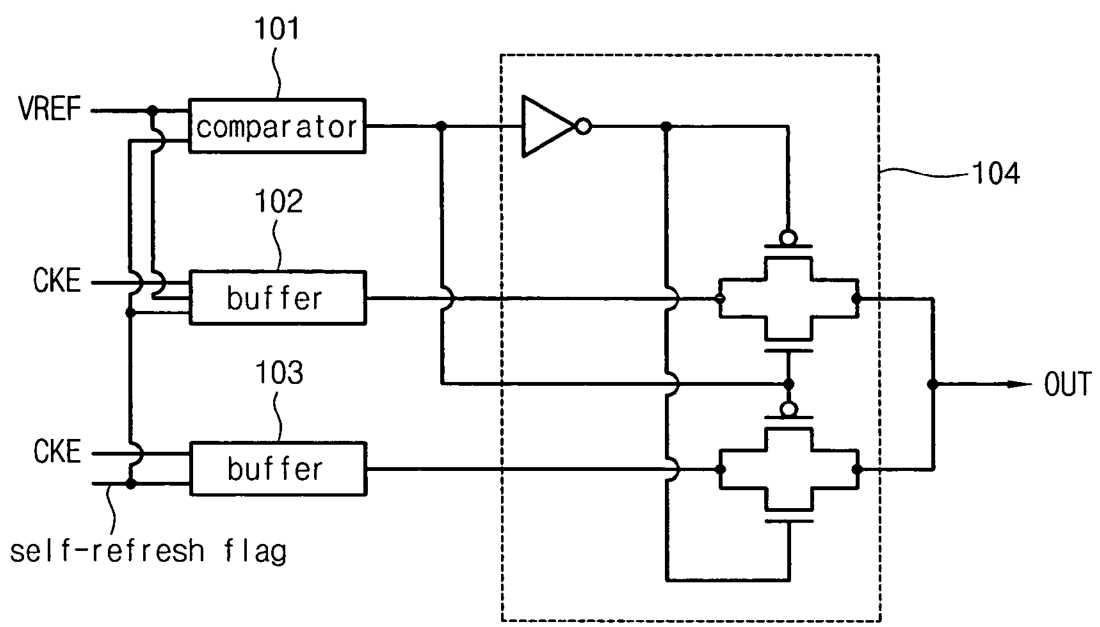
FIG. 1 is a block diagram illustrating the construction of a buffer device for a clock enable signal used in a memory device according to a preferred embodiment of the present invention.

Hereinafter, a preferred embodiment of the present invention will be described with reference to the accompanying drawings. In the following description and drawings, the same reference numerals are used to designate the same or similar components. Therefore, repetition of the description on the same or similar components will be omitted.

FIG. 1 is a block diagram illustrating the construction of a buffer device for a clock enable signal used in a memory device according to a preferred embodiment of the present invention.

Referring to FIG. 1, the buffer device according to the present invention includes a comparator 101, buffers 102 and 103 and a switching unit 104, and operates when the memory device enters into a self-refresh mode.

The comparator 101, the buffers 102 and 103 and the switching unit 104 receive a self-refresh flag signal. In the case of the self-refresh mode, the self-refresh flag signal is at a high level and in the case of escaping from the self-refresh mode, the self-refresh flag signal is at a low level.

The comparator 101 receives and compares a reference voltage VREF applied from an outside of the memory device and a reference voltage Vint generated internally. The internal reference voltage applied to the comparator 101 has a specified voltage level in the self-refresh mode.

The external reference voltage VREF may be changed in accordance with the kind of products that use the memory device. That is the external reference voltage VREF may be kept at a specified voltage level or at a ground level.

The buffer 102 a comparator type buffer that receives a clock enable (CKE) signal used in the memory device and has a differential amplifier structure. The buffer 102 receives and compares the CKE signal and the external reference voltage VREF.

The buffer 103 is a CMOS type buffer that receives the CKE signal used in the memory device. The buffer 103 receives and compares the CKE signal and the self-refresh flag signal.

That is, the buffers 102 and 103 are buffers that operate in the self-refresh mode and receive the CKE signal.

Figure 2:
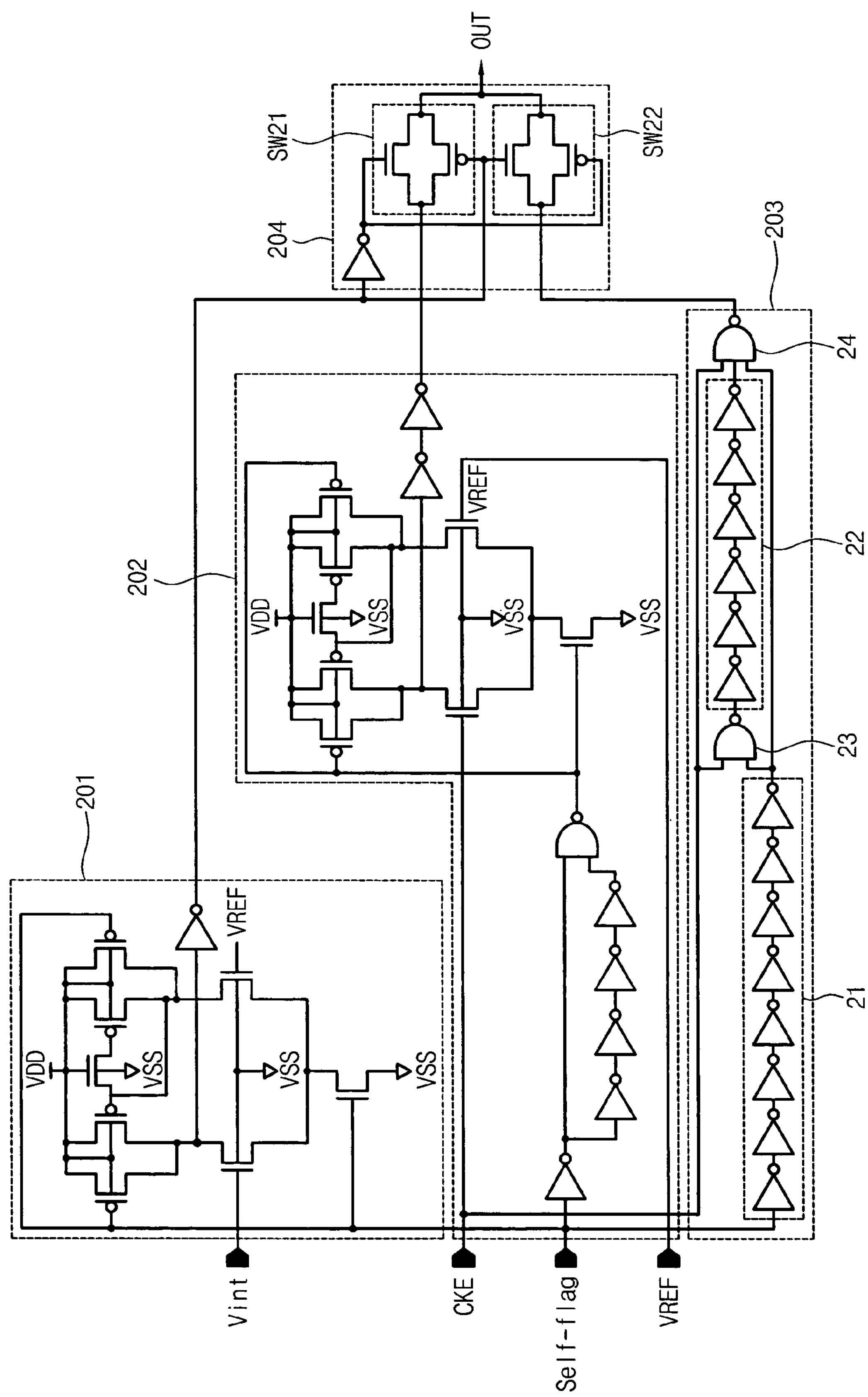
FIG. 2 is a detailed circuit diagram of the buffer device of FIG. 1.

FIG. 2 is a detailed circuit diagram of the buffer device of FIG. 1.

A comparator 201 of FIG. 2 corresponds to the comparator 101 of FIG. 1, buffers 202 and 203 correspond to the buffers 102 and 103, and a switching unit 204 corresponds to the switching unit 104 of FIG. 1.

The self-refresh flag signal is applied to the comparator 201 and the buffers 202 and 203. In the self-refresh mode, the self-refresh flag signal is kept at a high level. Accordingly, the comparator 201 and the buffer 202 are kept in an active state.

The comparator 201 compares the internal reference voltage Vint with the external reference voltage VREF. In the self-refresh mode, the internal reference voltage is kept at a specified level.

If the external reference voltage is higher than the internal reference voltage, the comparator 201 outputs a signal of a high level. By contrast, if the external reference voltage is lower than the internal reference voltage, the comparator 201 outputs a low-level signal.

If the output of the comparator is at a high level, a switch SW21 is turned on and an output of the buffer 202 is transferred to an output terminal OUT. If the output of the comparator is at a low level, a switch SW22 is turned on and an output of the buffer 203 is transferred to the output terminal OUT.

The buffer 202 is provided with a differential amplifying circuit, and compares the CKE signal with the external reference voltage VREF in accordance with the self-refresh flag signal.

Hereinafter, the operation of the comparator type buffer 202 will be explained.

First, if the CKE signal is at a low level in a state that the self-refresh flag signal is at a high level, the comparator type buffer operates as follows.

In this case, if the external reference voltage is at a low level, the buffer 202 malfunctions. Specifically, if the buffer 202 compares the low-level CKE signal with the low-level external reference voltage VREF, it may output an erroneous signal due to the influence of noise and so on. However, since the switch 21 is in a turned-off state at this time, the output of the buffer 202 is not transferred to the output terminal OUT. If the external reference voltage VREF is kept at a high level, the output of the buffer 202 becomes high. The output of the buffer 202 is transferred to the output terminal OUT through the switch SW21.

Meanwhile, the CMOS type buffer 203 receives the self-refresh flag signal and the CKE signal. As shown in FIG. 2, the CMOS type buffer 203 includes delay units 21 and 22, and NAND gates 23 and 24.

The delay unit 21 is composed of an even number of inverters, and receives and delays the self-refresh flag signal for a predetermined time.

The NAND gate 23 receives the CKE signal and an output signal of the delay unit 21, and outputs a NAND-gated signal.

The delay unit 22 is composed of an even number of inverters, and receives and delays the output signal of the NAND gate 23 for a predetermined time.

The NAND gate 24 receives the CKE signal, the output signal of the delay unit 21 and the output signal of the delay unit 22, and outputs a NAND-gated signal.

The output signal of the NAND gate 24 is the output signal of the CMOS type buffer 203.

The output signal of the CMOS type buffer 203 is transferred to the output terminal OUT if the switch SW22 is turned on.

The CMOS type buffer 203 outputs the signal in accordance with the state of the self-refresh signal, and the output signal of the CMOS type buffer 203 is controlled by the clock enable signal.

If the CKE signal is at a low level in a state that the self-refresh flag signal is at a high level, the output signal of the NAND gate 24 becomes high.

By contrast, if the CKE signal goes to a high level in a state that the self-refresh flag signal is at a high level, the output signal of the NAND gate 24 goes from a high level to a low level. The signal then goes to a high level again after a predetermined time elapse.

As described above, the comparator 201 selectively turns on either the switch SW21 or the switch SW22. Accordingly, either of the output signal of the comparator type buffer 202 and the output signal of the CMOS type buffer 203 is transferred to the output terminal OUT of the buffer device for the CKE signal.

As described above, if the CKE signal is at a low level, the output signals of the buffers 202 and 203 that operate normally become high. Accordingly, the signal of the output terminal OUT of the buffer device for the CKE signal is at a high level. If the signal of the output terminal OUT of the buffer device for the CKE signal is at a high level, a CKE buffer (not illustrated) that operates normally and receives the CKE signal is kept in a disable state and the self-refresh flag signal is kept at a high level.

By contrast, if the CKE signal goes from a low level to a high level, the output signals of the buffers 202 and 203 become low. Accordingly, the signal of the output terminal OUT of the buffer device for the CKE signal is at a low level. If the signal of the output terminal OUT of the buffer device for the CKE signal is at a low level, the CKE buffer (not illustrated) that operates normally and receives the CKE signal is kept in an enabled state and the self-refresh flag signal goes from a high level to a low level. Accordingly, the memory device escapes from the self-refresh mode.

If the memory device escapes from the self-refresh mode (i.e., if the memory device is in a normal operation mode), the buffer device for the CKE signal as shown in FIGS. 1 and 2 becomes disabled. By contrast, the CKE buffer (not illustrated) operates in a normal state.

The operation of the CKE buffer that operates in a normal state is controlled by the output signal of the buffer device for the CKE signal as explained with reference to FIGS. 1 and 2. Specifically, if the output of the buffer device for the CKE signal is at a high level, the CKE buffer that operates in a normal state is kept in a disable state, while if the output of the buffer device for the CKE signal is at a low level, the CKE buffer that operates in a normal state is kept in an enabled state.

From the foregoing, it will be apparent that if the buffer device for the CKE signal that operates in the self-refresh mode according to the present invention is used, the buffer device performs a selective operation in accordance with the reference voltage. Thus, the memory device can escape from the self-refresh mode at an accurate time.

Although a preferred embodiment of the present invention has been described for illustrative purposes, those skilled in the art will appreciate that various modifications, additions and substitutions are possible without departing from the scope and spirit of the invention as disclosed in the accompanying claims.

What is claimed is:

1. A buffer device for a clock enable signal in a memory device comprising:

a first buffer for comparing a clock enable signal with an external reference voltage in accordance with a self-refresh flag signal;

a second buffer for outputting a signal corresponding to the self-refresh flag signal as the clock enable signal;

a comparator for comparing the external reference voltage applied from an outside with an internal reference voltage internally generated; and a switching unit for selecting and outputting an output of the first buffer if the external reference voltage is higher than the internal reference voltage and selecting and outputting an output of the second buffer if the external reference voltage is lower than the internal reference voltage in accordance with an output signal of the comparator.

2. The buffer device as claimed in claim 1, wherein the self-refresh flag signal is at a high level corresponding to the self-refresh mode and at a low level corresponding to a normal mode, and the comparator and the first buffer are enabled if the self-refresh flag signal is at the high level and disabled if the self-refresh flag signal is at the low level.

3. The buffer device as claimed in claim 2, wherein the second buffer is implemented by a CMOS type buffer that operates in accordance with the clock enable signal.

4. The buffer device as claimed in claim 2, wherein the second buffer comprises:

a first delay unit for receiving the self-refresh flag signal;

a first NAND gate for receiving the clock enable signal and an output signal of the first delay unit;

a second delay unit for receiving an output signal of the first delay unit; and a second NAND gate for receiving an output signal of the second delay unit.

* * * * *